United States Patent
Marinov

(10) Patent No.: US 10,218,049 B2
(45) Date of Patent: Feb. 26, 2019

(54) ELECTRONIC DEVICE INCORPORATED INTO A SHEET

(71) Applicant: Uniqarta, Inc., Cambridge, MA (US)

(72) Inventor: Val Marinov, Fargo, ND (US)

(73) Assignee: Uniqarta, Inc., Cambridge, MA (US)

( * ) Notice: Subject to any disclaimer, the term of this patent is extended or adjusted under 35 U.S.C. 154(b) by 172 days.

(21) Appl. No.: 15/101,530

(22) PCT Filed: Dec. 4, 2014

(86) PCT No.: PCT/US2014/068560
§ 371 (c)(1),
(2) Date: Jun. 3, 2016

(87) PCT Pub. No.: WO2015/085064
PCT Pub. Date: Jun. 11, 2015

(65) Prior Publication Data
US 2016/0308269 A1  Oct. 20, 2016

Related U.S. Application Data

(60) Provisional application No. 61/912,451, filed on Dec. 5, 2013.

(51) Int. Cl.
*H01Q 1/22* (2006.01)
*H01Q 1/40* (2006.01)
(Continued)

(52) U.S. Cl.
CPC ......... *H01Q 1/2225* (2013.01); *B32B 37/226* (2013.01); *G06K 19/07718* (2013.01);
(Continued)

(58) Field of Classification Search
CPC .. G06K 19/067; G06K 19/07; G06K 19/0707; G06K 19/0708; G06K 19/0709; G06K 19/071; G06K 19/0723; G06K 19/07718; G06K 19/07722; G06K 19/07749; G06K 19/07773; G06K 19/07779; G06K 19/07783; G06K 19/0779; H01L 21/67144; B26B 37/22;
(Continued)

(56) References Cited

U.S. PATENT DOCUMENTS

| 2007/0007637 A1 | 1/2007 | Marinov |
| 2008/0210368 A1 | 9/2008 | Zakel |

(Continued)

FOREIGN PATENT DOCUMENTS

| WO | 2012/142177 | 10/2012 |
| WO | 2015/085064 | 6/2015 |

OTHER PUBLICATIONS

International Search Report and Written Opinion from PCT application PCT/US2014/068560 dated Mar. 4, 2015 (14 pages).

*Primary Examiner* — Robert Karacsony
(74) *Attorney, Agent, or Firm* — Fish & Richardson P.C.

(57) ABSTRACT

Among other things, a sheet has a thickness and extends in two dimensions normal to the thickness of the sheet. Within the sheet there is an electronic device having an integrated circuit and conductive elements connected to the integrated circuit. The electronic device extends in the two dimensions, the extent of the device in each of the two dimensions being greater than 3 mm.

18 Claims, 9 Drawing Sheets

(51) Int. Cl.
*G06K 19/077* (2006.01)
*B32B 37/22* (2006.01)
*H01L 21/67* (2006.01)

(52) U.S. Cl.
CPC .. *G06K 19/07722* (2013.01); *H01L 21/67144* (2013.01); *H01Q 1/40* (2013.01); *B32B 2309/105* (2013.01); *B32B 2317/12* (2013.01); *B32B 2519/02* (2013.01)

(58) Field of Classification Search
CPC ..... B26B 37/226; B32B 317/00; B32B 37/14; B32B 37/142; B32B 37/146; B32B 2519/02; B32B 2309/105
See application file for complete search history.

(56) References Cited

U.S. PATENT DOCUMENTS

2010/0277382 A1* 11/2010 Tanaka ............. G06K 19/07749
343/741
2014/0049436 A1* 2/2014 Kubo ................ G06K 7/10336
343/788

* cited by examiner

ELECTRONIC DEVICE INCORPORATED INTO A SHEET

CROSS-REFERENCE TO RELATED APPLICATIONS

This application is a U.S. national stage application under 35 USC § 371 of International Application No. PCT/US2014/068560, filed on Dec. 4, 2014, which claims the benefit of and priority to U.S. provisional application 61/912,451, filed Dec. 5, 2013, the contents of both which are incorporated here by reference in their entirety.

BACKGROUND

This description relates to incorporating electronic devices in a paper or other sheet.

A variety of items have been incorporated into paper for security and other purposes. These items include so-called security threads that can be seen by the human eye either directly or when the paper is held up to normal light or subjected to a special light source. Some items that are incorporated in the paper can be generally invisible to the human eye but detected and read by special techniques and devices. Some of these approaches are used in currency, for example, as a security measure.

The item to be embedded in the paper may be formed as a continuous strip of material that may or may not bear items on the strip of material. In some cases, the items that are on the strip and are to be embedded are discrete items, for example, integrated circuits (also referred to as ICs or as chips). The discrete items can be mounted or formed on a continuous strip of material that is embedded into the paper together with them. In this case, the strip of material is referred to as a carrier strip because it carries the discrete items.

In some cases, the items that are incorporated into the paper are embedded within the paper and not exposed at the surface of the paper. In some cases, portions of the items may be exposed at the surface.

Embedding such an item into paper can be done in a variety of ways, for example, by sandwiching the item between two layers. In some cases, such an item can be embedded during the process of making paper from a fiber slurry. The thickness of the item embedded in the paper during the process of making paper is such that the item would not give rise to any perceptible extra thickness in the vicinity of the paper containing the item. In other cases, the item is formed on the surface of the paper.

The material for the strip can be made of a material that is impermeable to the fiber slurry, such as paper, or an organic film, or metal foil, or a combination of them. The material for the strip can also be porous, or permeable to the fiber slurry, which enables the formation of paper around it when the paper is made from the fiber slurry. The strip materials can be dispersible in water, in a solvent, or removed by melting.

The item embedded in the paper can be an electronic device comprising a chip or chips. The electronic device can be fabricated using known semiconductor techniques such as thin-film methods on conventional silicon substrates or on layered silicon-insulator-silicon substrates, methods for inorganic printed electronics, or methods for organic electronics.

In some cases, the chip can be an RFID (radio frequency identification) chip. In general, RFID chips incorporated in paper can be associated with antennas that enable communication between the chips and the outside world. The chip may be placed in a non-conductive portion of the carrier strip and electrically connected (attached) to an antenna formed on the carrier strip. In some cases, the antenna formed on the carrier strip is a dipole antenna made of two conductive strips the size of which corresponds to the size of the paper. The chip may have an integrated, on-chip, antenna. The on-chip antenna may be inductively coupled to inductors placed on the carrier strip. In some cases, the on-chip antenna can be coupled to an additional antenna fabricated on a surface of the paper. In some cases, the chip is flush in a surface of the paper and attached to an antenna additionally formed on the surface.

SUMMARY

In general, in an aspect, a sheet has a thickness and extends in two dimensions normal to the thickness of the sheet. Within the sheet, there is an electronic device having an integrated circuit and conductive elements connected to the integrated circuit. The electronic device extends in the two dimensions, the extent of the device in each of the two dimensions being greater than 3 mm.

Implementations may include one or a combination of any two or more of the following features. The electronic device comprises two or more integrated circuits. The conductive elements comprise an antenna. The antenna is configured to operate in a predetermined frequency band and to be large enough to ensure a robust and reliable wireless communication over a range that is long enough for an application or context in which the electronic device is to be used. The sheet includes a continuous sheet, and there is more than one of the electronic devices within the sheet. The electronic device includes a transponder. The electronic device includes an RFID transponder. The antenna includes an antenna configured to operate in the predetermined frequency band either via magnetic field coupling or via electromagnetic wave propagation. The sheet includes paper. There is a carrier strip within the sheet. The carrier strip bears the electronic device. The electronic device is flexible.

The integrated circuit chip is thinner than 60% of the sheet thickness. The integrated circuit chip is thinner than 30% of the sheet thickness. The combined thickness of the carrier strip and the electronic device is less than or equal to a thickness of the sheet. The electronic device is held securely within the sheet. The carrier strip includes perforations. The perforations have geometric shapes with straight edges. The perforations are arranged in a repeated pattern along the strip. The perforations are large enough to permit the passage of fiber slurry during formation of the sheet. There are bridges adjacent to the perforations. The bridges are narrow enough to permit a flow of fiber slurry during formation of the sheet above and below each of the bridges to enable formation of sheet above and below each of the bridges so that the carrier strip is embedded within the sheet. The bridges are no more than 1 mm across. The bridges are no more than 3 mm across.

In general, in an aspect, a sheet includes a matrix of a material, and an electronic device at a location within the sheet. The electronic device includes conductive elements. The conductive elements have openings. A portion of the matrix of the material of the sheet lies within the openings of the conductive elements so that the conductive elements resist dislodging of the electronic device from its location in the sheet.

Implementations may include one or a combination of any two or more of the following features. The conductive elements comprise an antenna. The flexible sheet includes paper. The matrix includes fiber. The electronic device includes a transponder. The transponder includes an RFID transponder.

In general, in an aspect, a flexible carrier strip bears electronic devices in two or more rows arranged along a length of the carrier strip. The spacing of the electronic devices along each of the rows corresponds to a finished dimension of a sheet into which a portion of the strip and at least one of the electronic devices are to be embedded.

Implementations may include one or a combination of any two or more of the following features. The electronic devices include transponders. The transponders include RFID transponders. There are three or more rows of the flexible electronic devices, and pairs of adjacent rows are separated by equal distances that correspond to a finished dimension of the sheet. The electronic devices are spaced along each of the rows at regular intervals that correspond to a finished dimension of the sheet. The electronic devices are arranged along the rows so that electronic devices in different rows are at common positions along the length of the strip. The carrier strip includes perforations that enable the strip to be held securely within the sheet.

In general, in an aspect, a continuous length of a flexible web has a width. Two or more rows of electronic devices are held on the continuous flexible web along its length. The spacing of the rows of electronic devices across the web and the spacing of the electronic devices along each of the rows are arranged so that cuts can be made along two different dimensions of a sheet in which the flexible web is embedded to yield smaller sheets each having a length and a width and each including at least one of the electronic devices embedded in the sheet.

Implementations may include one or a combination of any two or more of the following features. The electronic devices include transponders. The transponders include RFID transponders. There are three or more rows of the electronic devices, and pairs of adjacent rows are separated by equal distances that correspond to a finished dimension of the sheet. The electronic devices are spaced along each of the rows at regular intervals that correspond to a finished dimension of the sheet. The electronic devices are arranged along the rows so that electronic devices in different rows are at common positions along the length of the web. The web includes perforations that enable the web to be held securely within the sheet.

In general, in an aspect, a flexible electronic device carrier strip is formed by forming flexible conductive elements in one or more rows along a length of the electronic device strip, connecting thin integrated circuit chips to the flexible conductive elements to form electronic devices, and forming perforations along the length of the carrier strip. The flexible conductive elements include openings corresponding to the perforations along the length of the carrier strip.

Implementations may include one or a combination of any two or more of the following features. The conductive elements comprise an antenna. The electronic devices include transponders. The transponders include RFID transponders. There are three or more rows of the flexible electronic devices, and pairs of adjacent rows are separated by equal distances. The electronic devices are spaced along each of the rows at regular intervals. The electronic devices are arranged along the rows so that electronic devices in different rows are at common positions along the length of the web. The web includes perforations that enable the web to be held securely within the flexible sheet. The carrier strip is embedded within a fluid matrix to become part of a sheet that will include a dried form of the matrix.

In general, in an aspect, a sheet is formed bearing flexible electronic devices, by forming, from a slurry including a liquid and a material suspended in the liquid, a continuous web to be dried to form the sheet. During the forming of the sheet, a continuous flexible carrier bearing one or more rows of the electronic devices is embedded within the continuous web to place the electronic devices at predetermined locations within the web. The electronic devices include conductive elements. The conductive elements and the carrier have perforations the boundaries of which are defined by bridges of the web. The slurry flows into the perforations after the carrier is embedded within the web. The web is dried to form the sheet. The material suspended in the liquid of the slurry cooperates with the perforations and the bridges of the carrier and the conductive elements to prevent dislodging of the electronic devices from the locations.

Implementations may include one or a combination of any two or more of the following features. The conductive elements comprise antennas. The electronic devices include transponders. The transponders include RFID transponders. The sheet includes paper. The liquid includes water, and the material includes fiber. There are three or more rows of the electronic devices that are evenly spaced across the carrier. The electronic devices are spaced evenly along the rows of the carrier.

In general, in an aspect, there is a paper and a carrier strip embedded in the paper. The carrier strip has perforations and bridges that are configured to assure that the carrier strip is securely embedded in the paper. An antenna is formed on the carrier strip. The antenna has an effective area large enough to provide a robust and reliable wireless communication over a longer operating range. The antenna is configured to operate in a predetermined frequency band. The carrier strip is sufficiently wide to permit the formation of the antenna on the carrier strip without compromising the integrity of the paper.

In general, in an aspect, a sheet is formed bearing flexible electronic devices, by forming from a slurry including a liquid and a material suspended in the liquid, a continuous web to be dried to form the sheet. During the forming of the sheet, one or more electronic devices are embedded within the continuous web, at predetermined locations within the web. The electronic devices include conductive elements and perforations. The boundaries of the perforations are defined by bridges of the electronic devices. The slurry flows into the perforations after the electronic device is embedded within the web, and the web is dried to form the sheet. The material suspended in the liquid of the slurry cooperates with the perforations and the bridges of the electronic device to prevent dislodging of the electronic devices from the locations.

These and other aspects, features, implementations, and advantages can be expressed as methods, apparatus, systems, components, and in other ways.

These and other aspects, features, implementations, and advantages will become apparent from the following description, and from the claims.

DETAILED DESCRIPTION

Figure 1A:
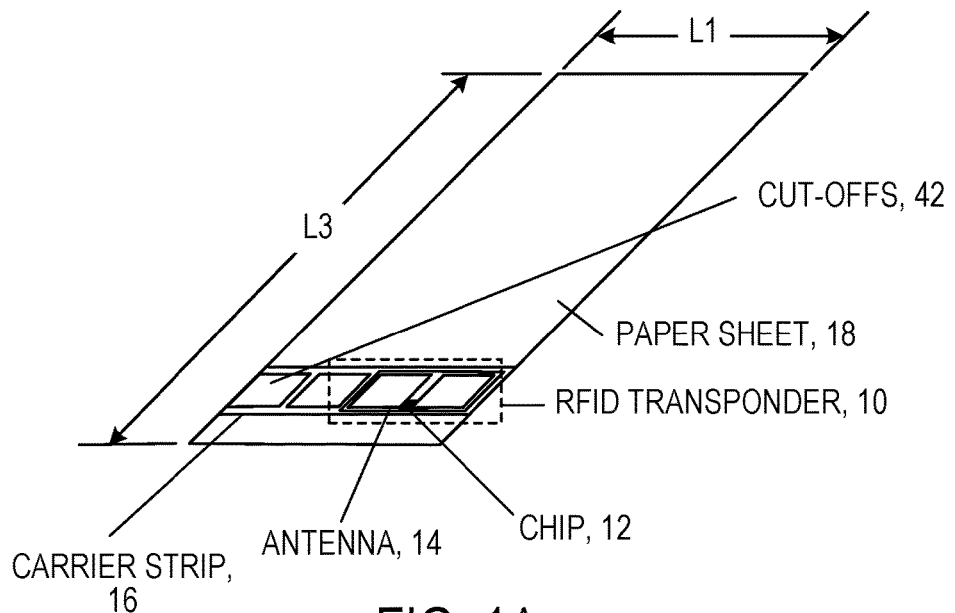
FIG. 1A is a schematic perspective view of a paper.

We describe here, among other things, new ways to embed electronic devices, for example, transponders that include integrated circuits and antennas, into sheets, for example, webs of paper (during the papermaking process). We also describe products that are new combinations of sheets (e.g., paper) and transponders. Among other things, the methods and products that we describe can be relatively simple, inexpensive, and effective. In that respect, these methods and products will open entirely new markets and applications for papers (or other sheets) in which RFID transponders (or other electronic devices) are embedded.

In examples in which the electronic devices include antennas, the antennas operate within predetermined frequency bands and are formed to be large enough (e.g., greater than 3 mm on a side) to ensure a robust and reliable wireless communication over a range that is long enough for the application or context in which the sheet is to be used.

In some examples, what we describe here involves making what we sometimes call RFID-enabled paper. In some cases, the paper contains a carrier strip that bear one or more radiofrequency identification (RFID) transponders integrally combined with the paper in a papermaking process and as a result the transponders become embedded in the finished paper. However, as we explain later, our concepts are not limited to such examples.

In our discussion, we use the term paper broadly to include, for example, any sheet that is produced by applying pressure to and drying moist fibers (for example, cellulose fibers) and has a grammage within a range of, for example, 60 g/m² to 350 g/m². Paper is an example of a broad range of sheets and continuous webs to which the techniques that we describe may be applicable. In some cases, the paper is flexible.

We use the term sheet broadly to include, for example, any material or item that extends in two dimensions and is relatively thin compared with the extent of the sheet in each of the two dimensions. Sheets can include cut sheets or individual sheets, and can include continuous sheets that have a particular width and extend continuously along the length. Sheets can include a wide variety of materials, including sheets made of natural fibers such as paper, or sheets made of synthetic material forms, such as synthetic paper or polymer films, or sheets made of a blend of organic and inorganic materials such as composite materials.

We use the term web broadly to include, for example, any sheet that has a particular width and extend continuously along its length. A web could be a finished roll of paper, for example. In some cases we use the term web to refer to a sheet of paper that is being formed, comprises unconsolidated wet fibers, and will be dried to form the finished sheet of paper.

We use the term carrier, carrier strip, and carrier web broadly to include, for example, any sheet, for example, a continuous strip, of material (typically flexible) that serves as a carrier of any kind of units that are to become part of a product, for example, antennas, electronic devices, transponders, integrated circuit chips, or other devices.

We use the term transponder broadly to include, for example, any electronic device that receives and transmits signals wirelessly, including, for example, devices that send electrical signals in response to interrogation signals whether powered locally or powered by electrical energy received wirelessly.

We sometimes use the term RFID transponder broadly to include, for example, a transponder that is configured to operate effectively within an RFID frequency band, system, environment, protocol, or context.

We use the term RFID-enabled broadly to include, for example, something, for example, a paper, that is capable of participating in or operating effectively within an RFID frequency band, system, environment, protocol, or context.

We use the term electronic device broadly to include, for example, any kind of electronic circuit, element, component, unit or system. A transponder is one kind of electronic device. An electronic device can include one or multiple active electronic components, or passive electronic components, or electromechanical components, or a combination of two or more of these. Active electronic components are those that show a gain, such as a voltage or current gain, or have a directional characteristic. Examples include but are not limited to integrated circuits, transistors, diodes, optoelectronic devices such as light-emitting diodes, power sources such as solar cells and electrochemical cells, and other. Passive components are those that do not exhibit gain or directional characteristics. They include resistors, capacitors, inductors, antennas, transducers, sensors, and other passive components. Electromechanical components can carry out electrical operations by using moving parts or by using electrical connections. Examples include but are not limited to micro-electromechanical systems (MEMS), piezoelectric devices, surface acoustic wave (SAW) devices, switches and relays, and other electromechanical components.

We use the term security element broadly to include, for example, an element that is associated with a paper, sheet, web, device, or other product and can reduce or prevent counterfeiting or forgery or other security risks associated with the other product.

We use the term antenna broadly to include, for example, any kind of electrical device that converts electric power into electromagnetic waves or magnetic flux and vice versa.

We use the term integrated circuit chip, or more simply chip, broadly to include, for example, any circuit formed on a small piece of, for example, semiconducting material.

We use the term long range broadly to include, for example, in the context of wireless communication, a distance between a communicating (e.g., embedded) electronic device and an external device that is long enough for effective use of the communicating electronic device in the application or in the context in which the devices are to be used. In a few specific examples long range could be a distance up to about 10 meters in the context of RFID communication, up to about 3 meters for passive UHF RFID systems, and up to about 30 centimeters for passive HF RFID systems.

We use the term perforation (which we sometimes use interchangeably with the term opening) broadly to include, for example, any kind of opening of any shape or size, for example, an opening that would allow for an uninterrupted structure of a paper surrounding an element that bears the perforation.

With respect to an integrated circuit chip, we use the term thin in a broad sense to include, for example, less than or equal to 50 μm. With respect to paper, we use the term thin broadly to include, for example, paper having a grammage generally between 60 to 120 g/m$^2$.

We use the term effective area in the context of an antenna broadly as a measure of how effective an antenna is, for example, at receiving the power of radio waves in the case of devices communicating using electromagnetic wave propagation or of a magnetic flux in the case of devices communicating via magnetic field coupling.

We use the term embed, and similarly the term within, broadly to include, for example, the holding of something entirely within something else so that none of the thing that is embedded or within the other thing is exposed at a surface of the other thing. For example, a carrier strip is embedded or within a paper or other kind of sheet if none of the carrier strip is exposed at either surface of the paper or sheet. We sometimes refer to something being partially embedded in a sheet to mean that at least part of the thing is fully embedded within the sheet and at least part of the thing is exposed at a surface of the sheet.

As mentioned earlier, although we use the example of an RFID transponder embedded in paper in much of our discussion below, the techniques and structures that we have devised can be applied more broadly, for example, to a range of devices and to various kinds of sheets.

As shown in FIG. 1A, an RFID transponder 10 that includes an integrated circuit chip 12 and an associated antenna 14 has been formed on a length of a carrier strip 16. The carrier strip is partially or completely embedded in a sheet of paper 18. We sometimes refer to a sheet of paper such as the one shown in FIG. 1A, containing an embedded RFID transponder, as an RFID-enabled paper.

RFID-enabled papers can have a very wide range of uses and applications in a very broad range of fields.

Figure 2:
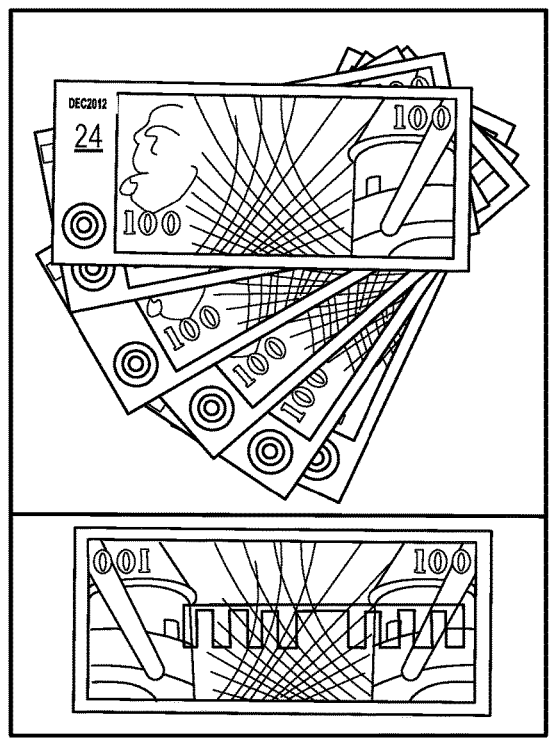
FIG. 2 shows pictures of banknotes with an embedded RFID transponder.

For example, as shown in FIG. 2, and RFID-enabled paper can be used as a security feature, for example, in a banknote 24. The fronts of a set of such bank notes are shown at the top of FIG. 2. In the bottom of FIG. 2, a backlit note is shown in which the embedded RFID transponder is visible.

Figure 3:
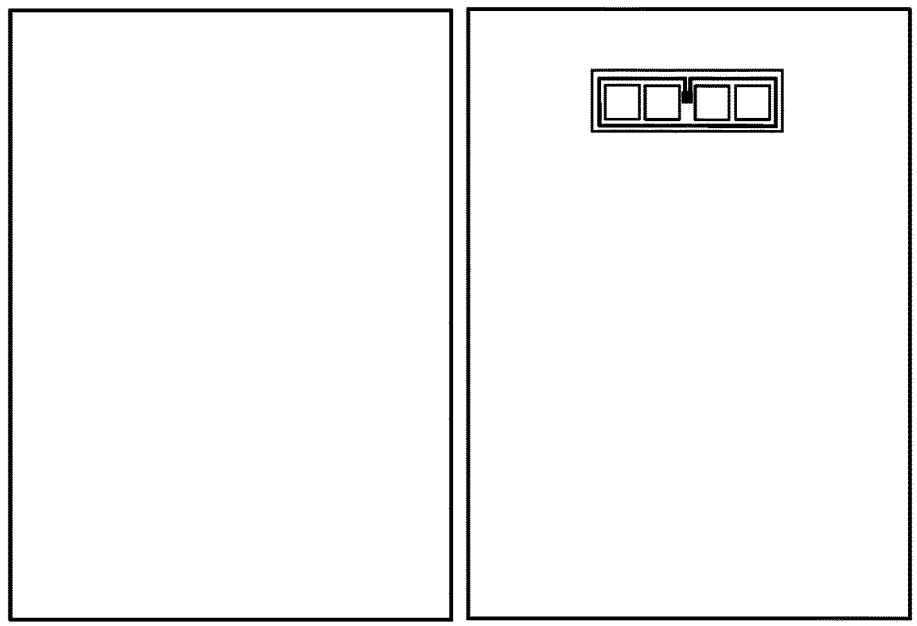
FIG. 3 shows paper with an embedded RFID transponder.

As shown in FIG. 3, more generally, the RFID-enabled paper 30 can appear to be and feel no different from a paper that does not have an RFID transponder embedded, as shown in the left side of the figure. When the paper is backlit, as shown in the right side, the RFID transponder becomes visible.

In some implementations of the methods and products covered by what we describe here, an RFID transponder includes an RFID-capable antenna and an RFID-capable chip electrically connected to the antenna. The RFID transponder is capable of operating in an RFID system to, for example, interact with, be powered by, or communicate information back and forth (or any two or more of those activities) with an RFID device in the external world, such as an RFID reader, or another component of an RFID system. Therefore, for example, an RFID-enabled paper is a paper that can be used in any application, environment, or context in which RFID functions and features are available or can be implemented.

In some instances, the RFID transponder is embedded completely in the paper during the papermaking process. That is, no portion of the RFID transponder is exposed at a surface of the finished paper. To aid the embedding of the RFID transponder in the paper during the papermaking process, in some cases, the RFID transponder (or a series of RFID transponders) is placed on a carrier strip before the paper is made. In some cases, the RFID transponder is passive in that it has no internal power source (such as a battery). Rather, it derives its power wirelessly from an external source.

The RFID transponder can have a broad range of operating characteristics, features, and functions. For example, the transponder can operate at frequencies within frequency bands that are allocated for RFID use, for example, the 13.56 MHz High Frequency (HF) band. In some instances, the RFID transponder can operate at frequencies within the 860 to 960 MHz Ultra High Frequency (UHF) band that is recommended for passive RFID by regulatory or standards bodies.

The RFID chip can be fabricated using a wide variety of fabrication technologies, including silicon semiconductor technology.

The paper that is formed with the RFID transponder embedded in it can have a wide variety of thicknesses. In some implementations, the paper can be as thin as "regular" paper (for example, having a thickness in the range of 50 μm to 150 μm, that is, for example, a grammage in the range of 60-120 g/m$^2$). When the paper is thin, in order to embed the RFID transponder, the components of the RFID transponder, in particular the RFID chip, must be relatively thin. The RFID chip could, therefore, be less than 50 μm thick, or, in some cases, be less than 30 μm thick. The thinner the RFID chip, the thinner the finished paper in which it can be embedded. The thinner the paper in which it can be embedded, the lower the cost and the broader the range of applications, fields, and contexts in which the RFID-enabled paper can be used.

Forming thin RFID chips for use in paper is also important because thin RFID chips, when fabricated using silicon technology, can be intrinsically less brittle and to some extent become flexible, which allows the chip to be embedded in flexible substrates or webs or sheets, such as thin paper.

RFID chips can also be embedded in thicker paper (such as, cardstock having a grammage in the range of 150-350 g/m$^2$). In such cases, the RFID chip can be less than 200 μm thick, or in some examples less than 100 μm thick.

In general, the thickness of the RFID chip and associated antenna and the carrier on which they are placed will be selected based on the thickness and flexibility desired in the finished paper. As a general rule, the thickness of the chip should be equal to or less than 60% of the paper thickness, for example, less than 30% of the paper thickness. The combined thickness of the carrier strip with the electronic device should be less than or equal to the thickness of the sheet.

Silicon wafers bearing large numbers of RFID chips of such thicknesses can be fabricated by known technologies.

Depending on the application for the paper, the transponder and the antenna that is part of the transponder can be any of a broad variety of types and have any of a wide range of configurations. The antenna may be of any type or design that would be suitable for wireless communication of the kind required for the application, for example with respect to range and frequency band.

In some cases, the antenna can be made of any conductive material. The antenna can be formed on the carrier strip using additive or subtractive manufacturing technology. As with the chip, the antenna can be fabricated to be relatively thin and have a degree of flexibility so that it can be embedded in paper during the papermaking process and also remain flexible when embedded within relatively thin paper or other sheets.

The carrier strip also can be made of any of a wide variety of materials or combinations of them and in a range of thicknesses and a variety of configurations. For example, the carrier strip could be a flexible material, such as a polymer or paper or metal foil or a combination of them. In some cases, for embedding in thin paper, the carrier strip can include polyester film with a thickness in the range of 10-25 µm. Film with a larger thickness, for example, in the range of 40-75 µm can be used for embedding in cardstock material.

The material for the carrier strip can be also water- or solvent-soluble such that, when wetted or immersed in a solvent bath, for example, during the sheet formation process, a degree of dissolution and migration of the carrier strip material occurs and, on drying, strong bonds are formed between the strip and the sheet.

In general, it is desirable that the carrier strip be formed or configured in such a way that, once embedded in the paper during the papermaking process, neither the carrier strip nor the transponder can be removed from the paper or become dislodged, or in any other way degrade the integrity of the paper. For that purpose, in some implementations, the carrier strip can be permeable (for example, because it has an open porous structure) or can be made permeable by perforations or other gaps or openings to allow for the liquid pulp to flow through it during the paper fabrication process, until the paper has been finished, or the paper can be both perforated and porous.

The paper in which the RFID transponder is embedded can have any of a very wide variety of sizes, finishes, material compositions, strength, and other characteristics, and can be in the form of a roll or web, or be in the form of individual sheets. In some embodiments, the paper (or the portion of it in which the transponder is embedded) is at least as thick as the combined thickness of the embedded carrier strip, antenna, and chip.

In some cases, the carrier strip is between 3 and 30 mm wide, but can be as wide as the width (L3) of the paper sheet (FIG. 1A). The width of the carrier strip can be selected to provide enough room for forming an RFID transponder with an antenna on the strip that is large enough to ensure a robust and reliable wireless communication over a range that is long enough for the application or context in which the paper is to be used. In some cases, the electronic device (e.g., the chip and the antenna) are greater than 3 mm on a side, and they can be considerably larger than 3 mm on a side.

For example, in inductively coupled RFID systems (high-frequency, HF) used for near-field communication (NFC), the operating distance is limited by the coupling factor between the antenna of the reader or interrogator or other external device, and the transponder antenna. If the transponder antenna is very small, for example, less than 100 mm$^2$ in area, the effective area of the antenna decreases and as a result, the operating distance drops until communication is not possible and the transponder can no longer communicate with the reader or other external device. Shielding caused by the material in which the antenna is embedded also reduces the operating range. Conversely, larger antenna sizes require more energy to create the current needed to power the chip. Therefore, good antenna areas for the HF antennas are in the range of 200 to 600 mm$^2$.

In backscatter-coupled RFID systems (UHF), the operating distance is determined by the antenna gain, which is a function of the effective area of the antenna and operating frequency. Larger effective areas increase the power available to the RFID chip and the power detected by the RFID reader, thus increasing the operating distance and providing more reliable communication. The size of the UHF antennas is typically determined by the resonant wavelength (frequency). For example, UHF RFID devices that can be read from a distance of up to 10 m operate at frequencies of about 900 MHz. A common ½ wavelength dipole antenna for this frequency would be 165 mm long. Fractions of the wavelength can be used, but the impedance matching becomes more complex and the operating range drops significantly. Very small on-chip antennas are also possible, for example, 3×4 mm and even smaller, but the operating distance for these RFID devices is typically measured in millimeters.

As shown in FIGS. 4A-D, some implementations of a carrier strip 40 are perforated (that is, they have perforations or openings) to enable the strip and antenna to be permeable to the fiber slurry. The perforations allow for the integration of the carrier strip with the RFID transponder into the paper during the papermaking process and to reduce the chance of there being any gaps in fibrous paper material adjacent to either of the faces of the carrier strip in the finished paper.

In FIGS. 4A-D, the perforation of the carrier strip is in the form of perforations, openings, gaps, or apertures 42 that have boundaries 44 defined by so-called bridges 46 of material of the strip. A bridge can lie between two openings or between one of the openings and the side edge 48 of the carrier strip. The perforations in the carrier strip can be arranged in an ordered or repetitive pattern, or a random pattern, or a combination of the two. The perforations can be of a regular shape such as squares, triangles, ovals, and similar, or of irregular shapes, or a combination of regular and irregular shapes.

In some implementations, the width and other configuration characteristics of each of the bridges and perforations (or at least a sufficient portion of them to ensure complete embedding and integration of the strip in the paper) are chosen so that when the paper is made, processes can occur within the fiber slurry that enable the carrier strip to be completely integrated into the finished paper. The smallest size of the perforations can be chosen, for example, to allow for a free flow of the fibrous material dispersed in the slurry through the perforations between the portions of the slurry separated by the carrier strip. Appropriate sizes for the perforations will depend, for example, on the composition of flow properties of the slurry. Among other things, the flow of the fiber slurry through the perforations during the making of the paper or the ability of fibers to loop over bridges of the carrier strip, or both, ensures that the fibrous structure of the paper in the region where the strip is embedded is uninterrupted. If the size of the perforations is too small, the flow of slurry may be blocked. If the combined width of the resulting blocked perforation and the surrounding bridges becomes too wide, the papermaking fibers cannot bridge through the strip. As a result, the strip will be exposed on one side of the paper instead of being embedded into the thickness of the paper.

In some cases, for this purpose, the width 50 of each bridge of the carrier strip may be no wider than the maximum width that, in the making of the paper, will allow for the complete integration of the carrier strip into the thickness of the paper without impermeable material of the bridges blocking the fibrous paper material in the slurry from spanning across and integrating the carrier strip into the finished paper. For this purpose, the width of each of the bridges can be 3 mm or less, for example.

Figure 4A:
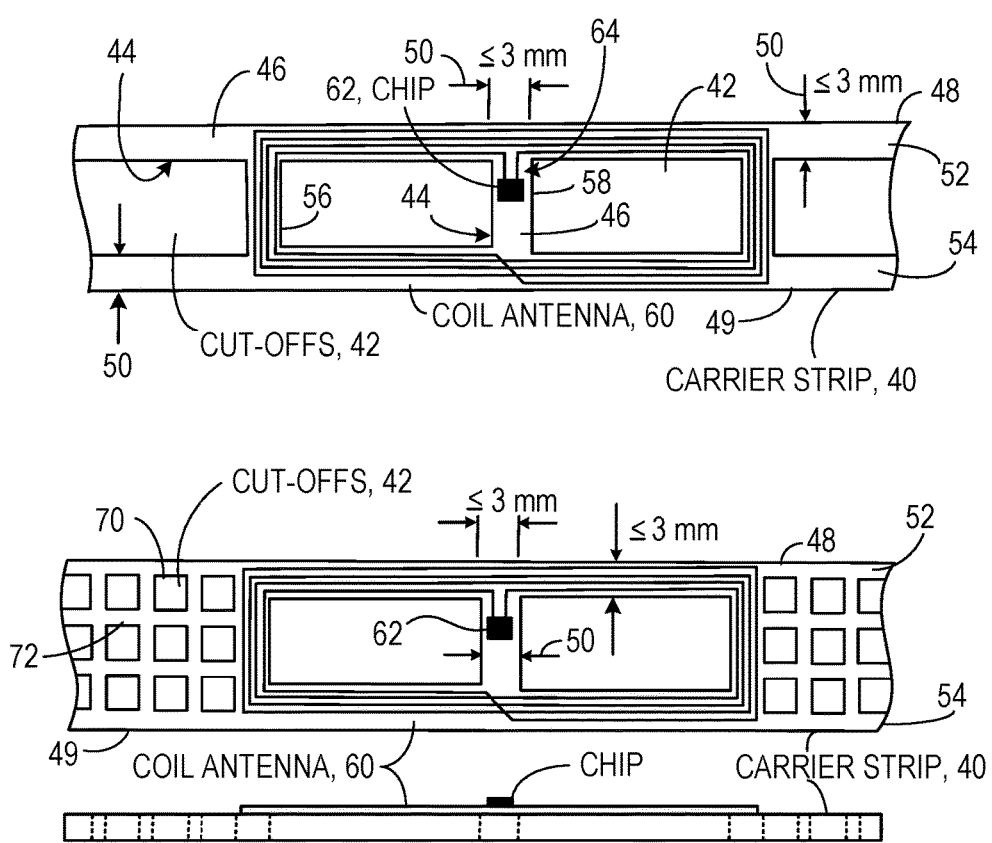
FIGS. 4A-D show top and side views of perforated carrier strips.

As shown at the top of in FIG. 4a, in some examples, the carrier strip has two parallel edges 48, 49, each of which is defined by two bridges 52, 54 that run along the length of the strip. The width 50 of each of the bridges 52, 54 can be less than or equal to 3 mm. Cross bridges 56, 58 spaced at regular intervals along the length of the strip can connect the two side bridges so that the side bridges and the cross bridges together define a series of identical rectangular perforations 42. The antenna 60 can be in the form of a coil antenna the loops of which span the width of the carrier strip and the length of two of the perforations plus three of the bridges, as shown. The integrated circuit chip 62 can be placed over the two ends 64 of the antenna coil on one of the bridges. This arrangement helps to assure that not only the carrier strip is bound to and integrated with the finished paper, but also that the antenna and the chip are similarly integrated.

As shown in the middle and bottom of FIG. 4a, in some arrangements of perforations of the carrier strip, the strip can be organized in alternating sections A and B. Section A is like the one shown in the top part of FIG. 4a. Section B includes a grid of smaller, square perforations 70 separated by bridges 72 each of which is narrower, say, 1 mm wide (but in any case less than or equal to 3 mm). This arrangement may permit a more intimate interlocking and integrating of the fiber of the fiber slurry with the carrier strip during the making of the paper.

Figure 4B:
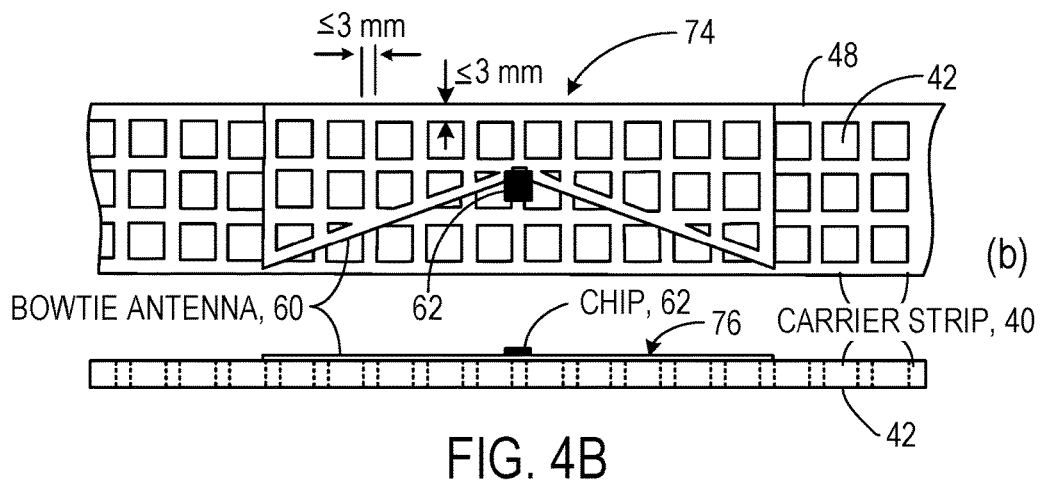

As shown in FIG. 4b, in some implementations, the antenna 60 can be in the form of a bowtie antenna having a bowtie shape 74, an example of a resonant transponder antenna typically used in UHF RFID systems. In the example shown, the entire length of the carrier strip bears a grid of small square perforations. The bowtie antenna is similarly perforated and supported by the bridges, each of which could be less than or equal to 3 mm wide. In these cases, the chip is placed at the point of the two angled edges of the bowtie as shown. The HF (inductive coupling) RFID systems use an inductor or a coil, as an "antenna" to provide the needed inductance.

Figure 4C:
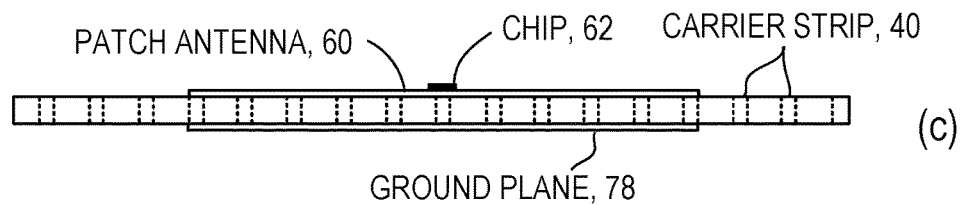

As shown in FIG. 4C, in some cases, the antenna 60 can be in the form of a rectangular (or other shape) patch antenna on one face of the carrier strip and having a rectangular (or other shape) conductive ground plane 78 on the opposite face of the carrier strip. Patch antennas are resonant antennas used in UHF systems.

Figure 4D:
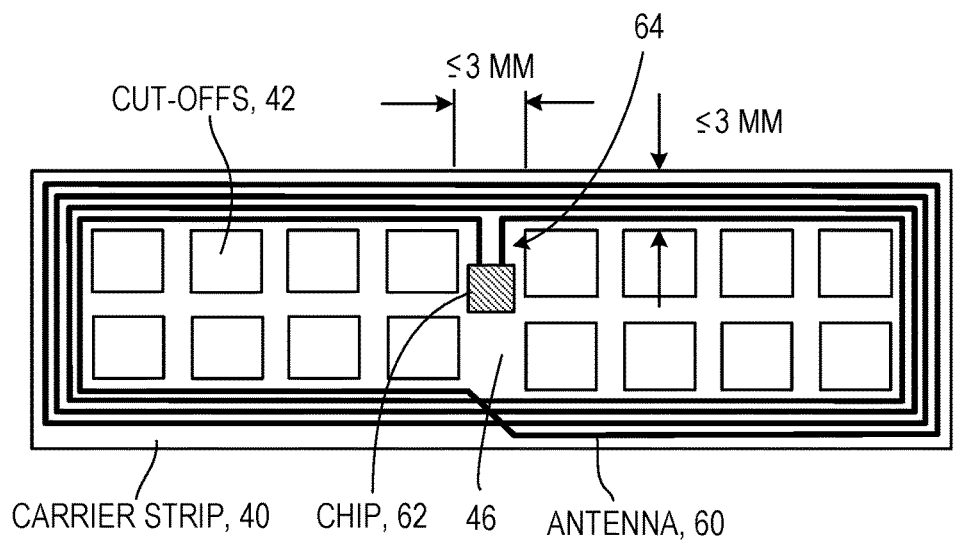

As shown in FIG. 4D, in some cases, the antenna 60 can be in the form of a coil antenna the loops of which span the width of the carrier strip and the length of the carrier strip. In this example, the carrier strip is shown as a discontinuous strip, and, the antenna 60 forms a perimeter around the series of identical rectangular perforations 42. Other arrangements of the antenna would be possible.

Among other advantages, the perforations of the carrier strip may reduce or eliminate a need to cover the strip with an adhesive coating traditionally used on embedded polymeric threads to promote adhesion between the thread and the papermaking fibers. The fibers will be able to bridge the carrier strip through the perforations thus locking the carrier strip in place and making the removal of the strip by pulling it out from the side of the paper sheet essentially impossible.

In some implementations, the carrier strip can be fabricated as follows.

Figure 1B:
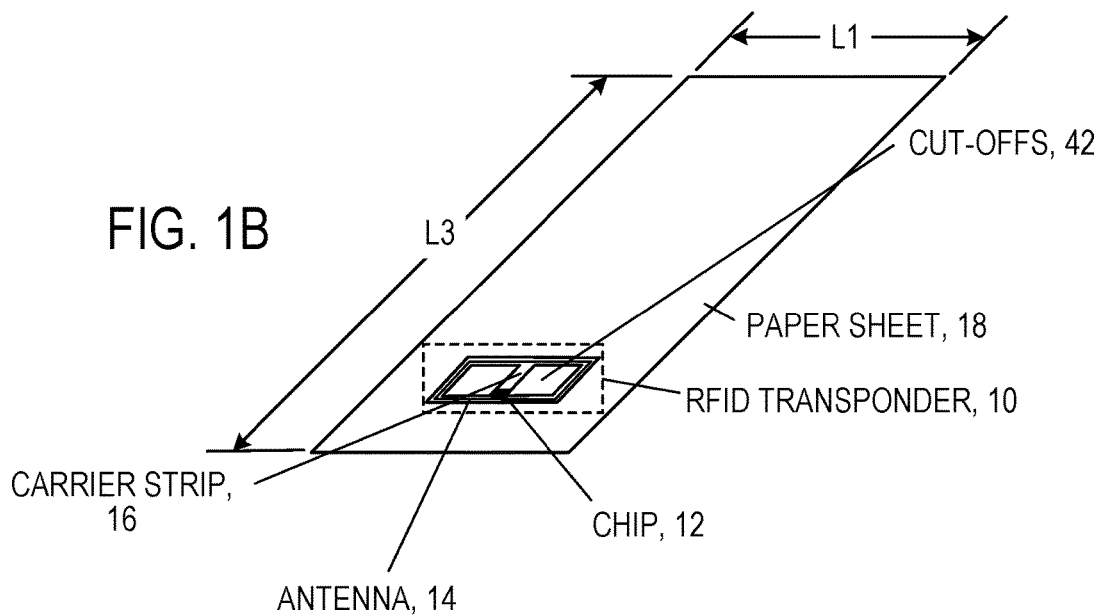
FIG. 1B is a schematic perspective view of a paper.
Figure 5:
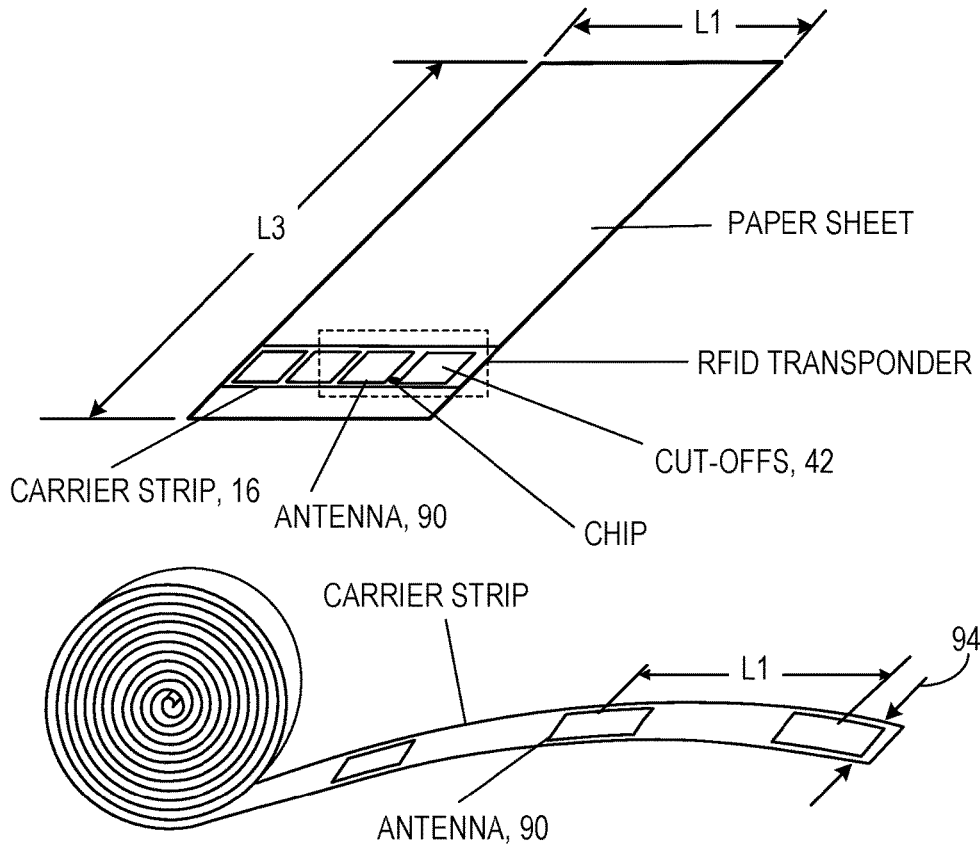
FIG. 5 is a perspective view of a carrier strip with antennas.
Figure 6:
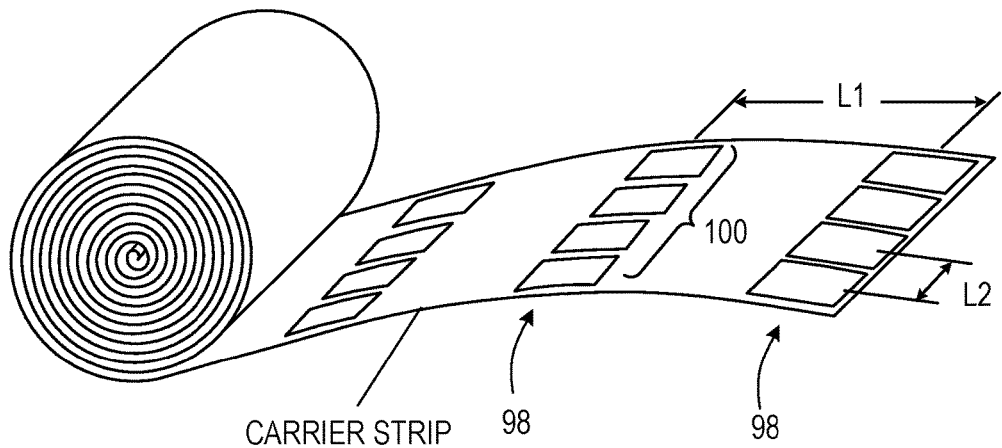
FIG. 6 is a perspective view of a carrier strip with antennas.

As shown in FIG. 5, the top part of which is similar to FIG. 1A, a series of antennas 90 are formed at regular intervals L1 along the length of the carrier strip. In the example of FIG. 5, length L1 is the same as one dimension of the finished paper. In some cases, the finished paper of dimension L1 is cut from a continuous web of paper that has been formed with the continuous carrier strip embedded in it. Any of a variety of techniques can be used to fabricate antennas on flexible substrates. In some cases, the carrier strip need not be continuous but could be in the form of individual cut carrier strips (or what could be called substrates) each of which would be embedded in a portion of the paper that is to become a finished paper sheet as shown in FIG. 1B.

In the implementations illustrated in FIG. 5, the width of the carrier strip will depend on the width 94 of the RFID antenna, which in turn will depend on the particular application. Typical widths of the carrier strip and the antennas would be in the range of 6 to 30 mm.

In some cases, to reduce the cost and achieve other goals, the antennas need not be fabricated in a single row along the length of the carrier strip. The carrier strip can be made wide enough to place multiple antennas 100, for example, at each position 98 along the carrier strip. In this case, the distance L2 (or pitch) between the antennas across the carrier strip can be determined by the width of the antennas and the capabilities of the equipment used to fabricate the antennas and need not be related to the dimensions of the paper. In some cases, the antennas need not be placed in columns across the strip, but can be staggered.

In some examples, after the antennas have been formed on the carrier strip, the carrier strip is populated with RFID chips by placing them and causing them to be electrically connected to the antennas to form RFID transponders.

Figure 7:
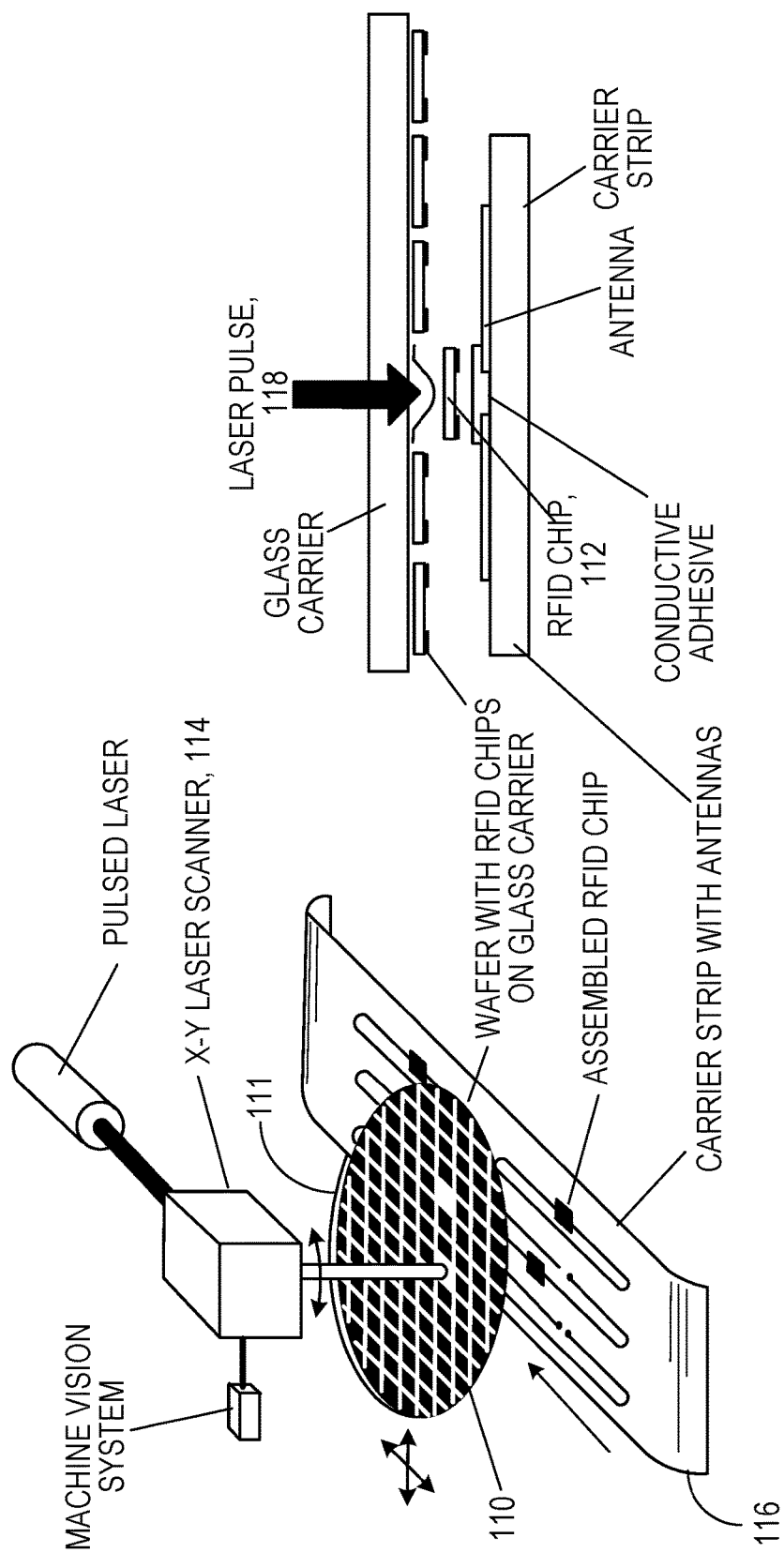
FIG. 7 is a schematic view of a chip assembly process.

As shown in FIG. 7, if the carrier strip is to be embedded in paper, the RFID chips can be attached to the carrier strip by using a laser contactless technology for ultra-thin chips assembly (which we call LEAP), disclosed in PCT WO2012142177, which is incorporated here by reference in its entirety. Other methods that can handle thin chips can be used to deliver and cause the chips to be attached to the carrier strip and the antenna.

In some cases, if the thickness of the paper is greater than 150 g/m$^2$ (typical for card stock), thicker than 50 μm integrated circuit chips can be assembled using known methods for chip assembly.

In the technique shown in FIG. 7, a thin wafer 110 of singulated RFID chips 112 held on a glass carrier 111 is carefully positioned beneath an X-Y laser scanner 114 in coordination with the motion of the carrier strip 116 past the scanner. When a position at which an RFID chip is to be placed on an antenna appears, a laser pulse 118 is fired at the backside of the RFID chip, releasing it so that it can drop onto the antenna pads.

In some examples, the material used to electrically bond the chip to the antenna pads can be a conductive adhesive in a semi-solid (paste) or solid (film) form. Other methods for attaching each chip to the corresponding antenna can also be used.

Figure 8:
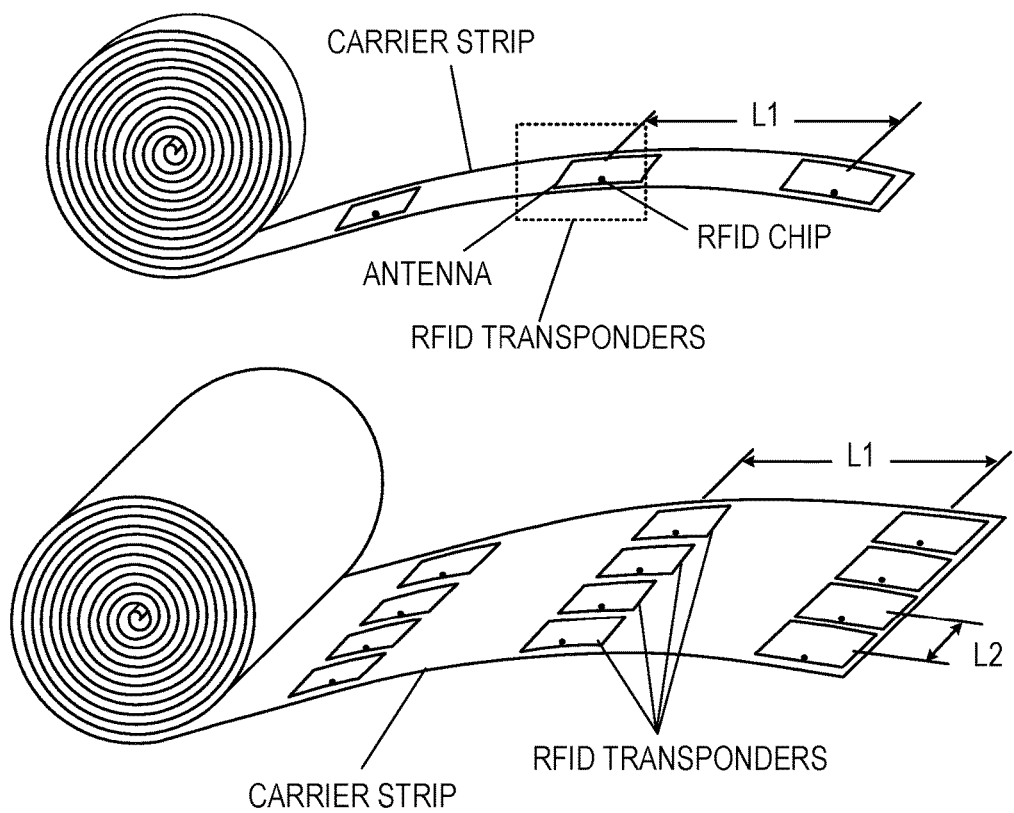
FIG. 8 is a schematic perspective view of a single row carrier strip and a multiple-row carrier strip.

FIG. 8 shows the carrier strip bearing the antennas and the RFID chips on the antennas in two versions, a single row of RFID transponders in the upper part of the figure, and multiple rows in the lower part of the figure.

Figure 9:
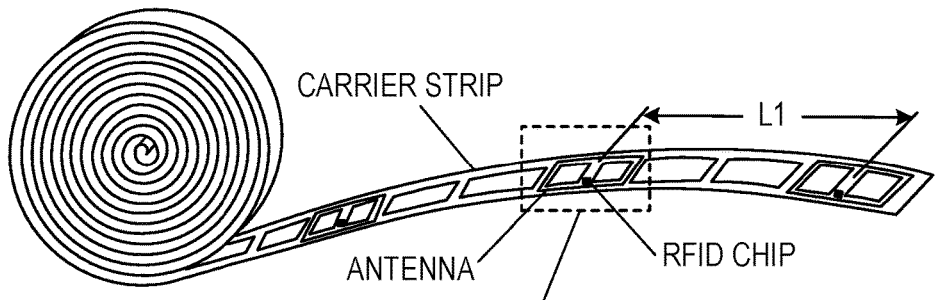
FIG. 9 is a schematic perspective view of a perforated carrier strip.

As shown in FIG. 9, for a version of carrier strip that has only a single row of transponders, after the chips have been attached to the antennas, the strip can be perforated using one of the patterns described above or a variety of other patterns. In some examples, the carrier strip can include multiple rows of transponders.

In some implementations, if the carrier strip has more than one RFID transponder per position along the length of the strip, as in the example shown in the bottom part of FIG. 8, the carrier strip can be cut along the length to produce strips with only one transponder per position such as this shown in the upper part of FIG. 8. Forming multiple transponders for each position and then slitting the strip in this way can save money and time.

Perforation of the strip can be done by any of a wide variety of techniques, for example, punching with mechanical dies, laser cutting, chemical and plasma etching, or a combination of two or more of those.

In some instances, the perforation can be done at a different stage, for example, before the antennas are fabricated, after the antennas are fabricated and before the chips are attached, or even before the antennas are fabricated. In some cases, the perforation can be done later, before the strip is embedded in the paper.

Although not required, in some cases the carrier strip may be covered or coated with an adhesive-promotion material before being embedded into the paper. The adhesive-promotion material can enhance the bonding of the fibers in the fibers slurry to the carrier strip. In some instances, the adhesive-promotion material can be a heat-sealable adhesive such as polyvinyl acetate emulsion. The adhesive-promotion material can be added to the carrier strip by coating or printing or other techniques. For example, the carrier strip could be dipped in a heat-sealing adhesive, removing surplus liquid from the strip by passing it through a current of air, and drying the strip in a current of warm air.

The carrier strip with RFID transponders can be used with and embedded in the paper in the course of a variety of different papermaking processes. In some implementations, the carrier strip is designed to be used with papermaking processes that begin with a wet fiber slurry and end with a finished web or individual sheets of paper. During the course of the process, while the fiber slurry remains wet, typically before or during the period when it is formed into a mass of slurry in the shape of the paper, the carrier strip is inserted in such a way that is not exposed at the upper or lower surfaces of the slurry mass, but rather is immersed in or held within the mass. As the slurry mass dries to form the paper, the strip remains in position and becomes locked within the matrix of the paper.

Figure 10A:
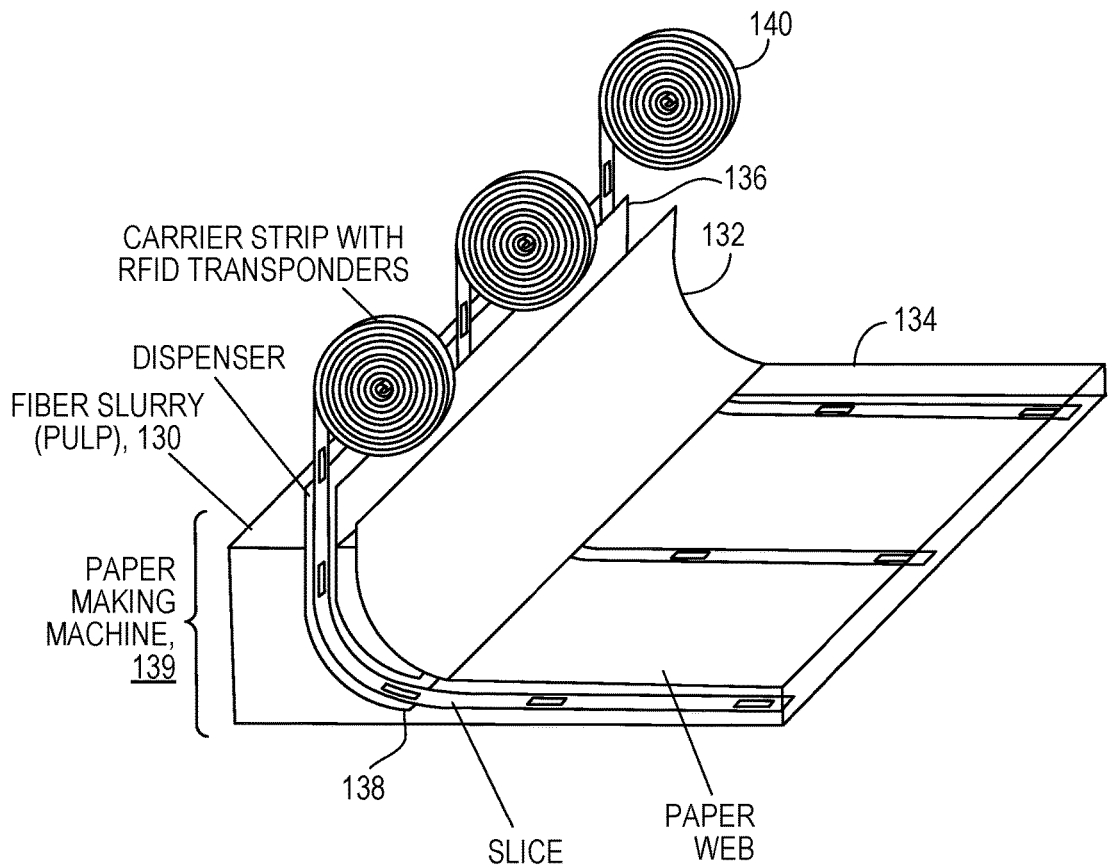
FIGS. 10A-B are a schematic perspective views of a papermaking process

For example, one method for embedding a carrier strip in a paper is described in U.S. Pat. No. 4,437,935, incorporated in its entirety by reference here, which is illustrated in FIG. 10A, in the case of a Fourdrinier papermaking machine. As shown in FIG. 10A, in the machine 139, a supply of fiber slurry 130 is drawn along from left to right towards a curved wall 132, which forces the formation of a mass (or web) 134 of wet fiber slurry that has a thickness and width corresponding to a final thickness and width of the finished paper. Upstream of the wall 132, a curved dispenser 136 is positioned at a distance behind the curved wall and has a delivery end 138 that is positioned above the bottom of the slurry supply and slightly behind the bottom edge of the curved wall. Reels of carrier strip 140 supply carrier strip down through the strip dispenser enabling it to exit in a position that is embedded within the fiber slurry mass as shown.

In some examples, the carrier strip can be also embedded in the paper outside of the headbox, after the slurry leaves the slice and downstream of the wall 132, by forcing the carrier strip inside the fiber slurry or by laying the carrier strip on the surface of the fiber slurry mass. In some cases, the carrier strip is placed such that the chip or the electronic components are facing or oriented towards the fiber slurry mass.

Figure 10B:
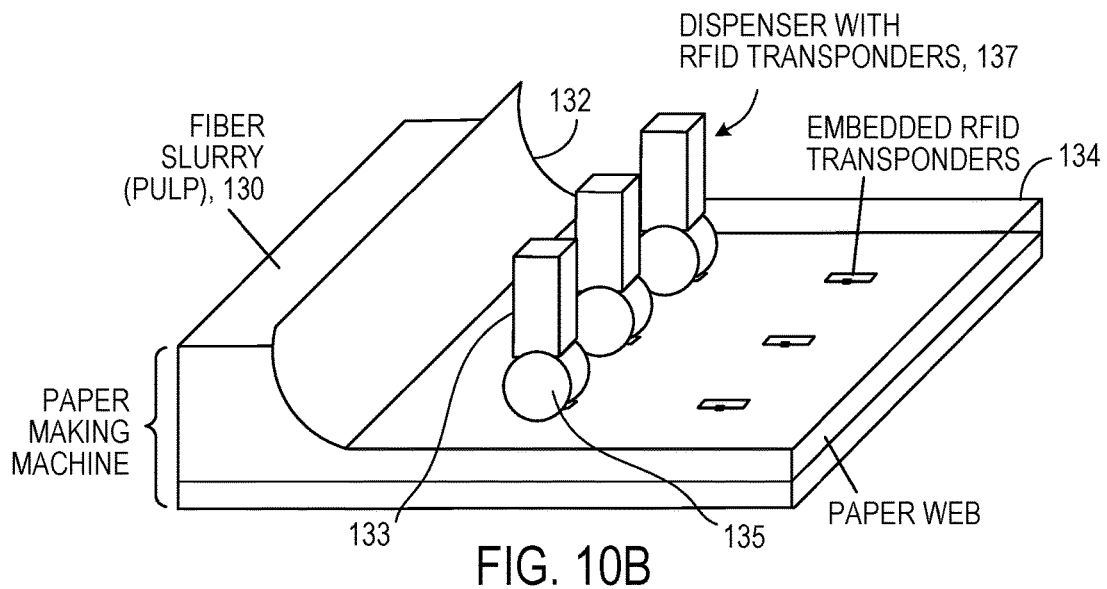

In some cases, as shown in FIG. 10B, one or more dispensers 137 are positioned at a distance in front of the curved wall 132 above the bottom of the mass 134 of wet fiber slurry. The dispensers 137 supply individual RFID transponders through the dispenser 137 enabling the RFID transponders to exit in a position that is embedded within the fiber slurry mass as shown. In this example, discrete portions of the fiber slurry mass can be embedded with one or more RFID transponders such that each discrete portion carries an electronic device.

In some cases, the one or more dispensers 137 include one or more rotating cylinders 135 for contacting and removing the carrier strip located in a cartridge 133 via a vacuum. In some examples, the cartridge 133 is located above the one or more rotating cylinders 135 as shown in FIG. 10b. The vacuum can be discontinued to release the individual carrier strip into the fiber slurry mass once the carrier strip is positioned above the fiber slurry mass. While a vacuum force can be used to transport the carrier strips, other known transport techniques can also be used to transport the carrier strips.

The fiber slurry with the carrier strip embedded in it is deposited on a moving endless belt of wire or plastic screen where the excess water is drained from the slurry, forming a continuous web of fibrous material. As the web travels along the belt, additional water is removed, and the cellulose fibers are aligned in an uniform direction giving the paper strength and stability. The water in the slurry above the carrier strip drains through the perforations in the strip carrying fibrous material with it. This process allows the fibrous material in the slurry above the strip to consolidate with the fibrous material under the strip thus providing continuity in the paper structure. The paper is further dried by pressure and heat between a series of rollers in the paper making machine. At this point, the carrier strip and paper fibers are compacted together to form paper in which the carrier strip is completely surrounded by (embedded within) the consolidated paper fibers. Then, calendar rollers smooth out the surface of the paper and impart gloss or any other desired finish to its surface.

In some implementations, for example, when used with a paper machine equipped with a cylinder mold, the carrier strip may be introduced through supply ducts placed along the machine width and opening into the headbox near the cylinder mold, ahead of the point where the draining of the fibrous suspension on the wire of the cylinder mold begins. After draining, a paper stock in which the carrier seat is embedded is obtained, which is then pressed and dried in the papermaking process.

In some cases, multiple carrier strips with RFID transponders are embedded along and across the paper web to provide each sheet of RFID-enabled paper with a desired number of RFID transponders. This requires the carrier strips with RFID transponders to be spaced at intervals corresponding to the L3 dimension of the paper sheet.

Figure 11:
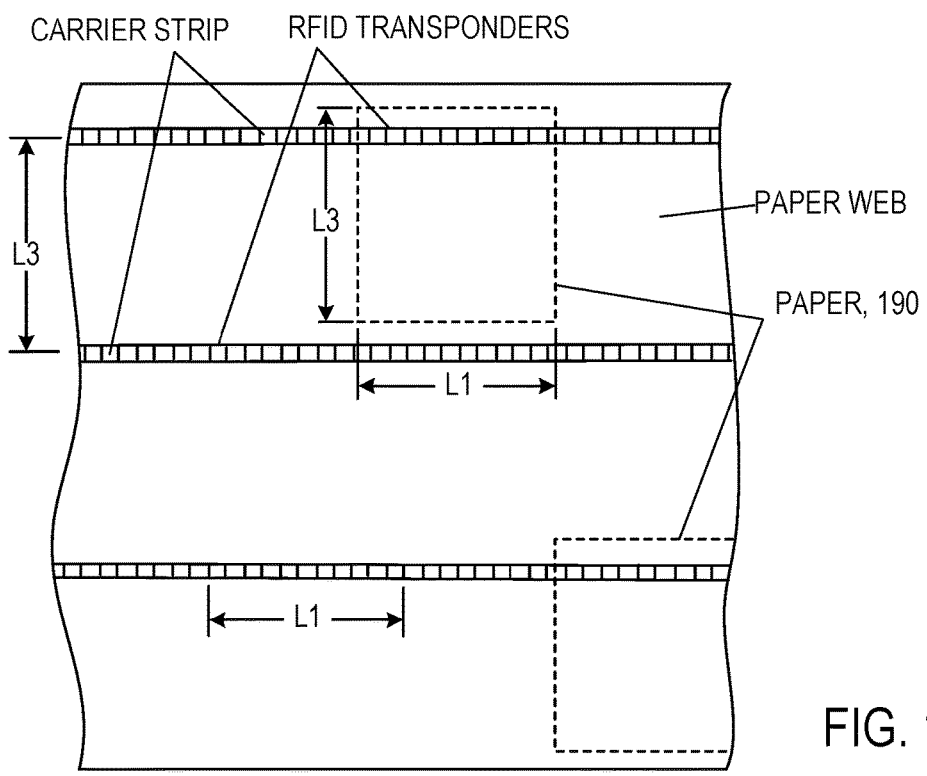
FIG. 11 is a schematic top view of a fragment of the paper web containing transponders.

For example, as shown in FIG. 11, by spacing the carrier strips at a distance L3, and by spacing the transponders at a distance L1, and by cutting the paper 190 as shown, it is possible to form at one time a paper web from which multiple papers each bearing a single transponder can be cut, each paper having dimensions L1 by L3.

Other implementations are also within the scope of the following claims.

Although the discussion above refers frequently to the embedding of an antenna in a sheet, the techniques that we have described are to create other kinds of conductive structures within a sheet. For example, conductive paths can be formed within the paper sheets that are not to be used to perform an antenna function. In some cases, the conductive paths could be interconnects between multiple active or passive electronic components in the paper or interconnects from an embedded electronic component to a metalized contact or other electronic components on the surface of the paper.

What is claimed is:

1. A method comprising
forming a flexible electronic device carrier strip by
   forming flexible conductive elements in one or more rows along a length of the electronic device strip,
   connecting thin integrated circuit chips to the flexible conductive elements to form electronic devices, and
   forming perforations along the length of the carrier strip,
   the flexible conductive elements including openings corresponding to the perforations along the length of the carrier strip.

2. The method of claim 1 in which the conductive elements comprise an antenna.

3. The method of claim 1 in which the electronic devices comprise transponders.

4. The method of claim 3 in which the transponders comprise RFID transponders.

5. The method of claim 1 in which there are three or more rows of the flexible electronic devices, and pairs of adjacent rows are separated by equal distances.

6. The method of claim 5 in which the electronic devices are spaced along each of the rows at regular intervals.

7. The method of claim 5 further comprising arranging the electronic devices along the rows so that electronic devices in different rows are at common positions along the length of a web.

8. The method of claim 7 in which the web comprises perforations that enable the web to be held securely within the flexible carrier strip.

9. The method of claim 1 further comprising embedding the carrier strip within a fluid matrix to become part of a sheet that will include a dried form of the matrix.

10. A method comprising
forming a sheet bearing flexible electronic devices, by
   forming, from a slurry comprising a liquid and a material suspended in the liquid, a continuous web to be dried to form the sheet,
   during the forming of the sheet, entirely embedding within the continuous web, a continuous flexible carrier bearing one or more rows of the electronic devices to place the electronic devices at predetermined locations within the web, the electronic devices comprising conductive elements, the conductive elements and the carrier having perforations the boundaries of which are defined by bridges of the continuous web,
   the slurry flowing into the perforations after the carrier is embedded within the web, and
   drying the web to form the sheet, the material suspended in the liquid of the slurry cooperating with the perforations and the bridges of the carrier and the conductive elements to prevent dislodging of the electronic devices from the locations.

11. The method of claim 10 in which the conductive elements comprise antennas.

12. The method of claim 10 in which the electronic devices comprise transponders.

13. The method of claim 12 in which the transponders comprise RFID transponders.

14. The method of claim 10 in which the sheet comprises a paper.

15. The method of claim 10 in which the liquid comprises water and the material comprises fiber.

16. The method of claim 10 in which there are three or more rows of the electronic devices that are evenly spaced across the carrier.

17. The method of claim 10 in which the electronic devices are spaced evenly along the rows of the carrier.

18. A method comprising
forming a sheet bearing flexible electronic devices, by
   forming, from a slurry comprising a liquid and a material suspended in the liquid, a continuous web to be dried to form the sheet,
   during the forming of the sheet, entirely embedding within the continuous web, the flexible electronic devices at predetermined locations within the web, the electronic devices comprising conductive elements and perforations having boundaries defined by bridges of the electronic devices,
   the slurry flowing into the perforations after the electronic device is embedded within the web, and
   drying the web to form the sheet, the material suspended in the liquid of the slurry cooperating with the perforations and the bridges of the electronic device to prevent dislodging of the electronic devices from the locations.

* * * * *